(12) United States Patent
Stoler

(10) Patent No.: US 9,800,400 B1
(45) Date of Patent: Oct. 24, 2017

(54) CLOCK PHASE ALIGNMENT IN DATA TRANSMISSION

(71) Applicant: Amazon Technologies, Inc., Seattle, WA (US)

(72) Inventor: Gil Stoler, Nofit (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/952,409

(22) Filed: Nov. 25, 2015

(51) Int. Cl.
*H04L 7/00* (2006.01)
*H03K 3/037* (2006.01)
*H04L 7/033* (2006.01)

(52) U.S. Cl.
CPC ............ *H04L 7/0091* (2013.01); *H03K 3/037* (2013.01); *H04L 7/0037* (2013.01); *H04L 7/0331* (2013.01)

(58) Field of Classification Search
CPC ......... H04L 7/0091; H04L 7/033; H04L 7/00; H04L 7/0016; H03K 3/038; H03L 7/08; H03L 7/087
USPC ................................. 375/376, 354, 371, 375
See application file for complete search history.

(56) References Cited

U.S. PATENT DOCUMENTS

| | | | | |
|---|---|---|---|---|
| 5,008,879 A * | 4/1991 | Fischer | ............. | H04L 12/40032 370/400 |
| 5,451,894 A * | 9/1995 | Guo | ...................... | H03L 7/0814 327/237 |
| 6,046,620 A * | 4/2000 | Relph | ..................... | H03K 5/133 327/277 |
| 6,272,439 B1 * | 8/2001 | Buer | ..................... | G01R 23/175 327/158 |
| 6,718,477 B1 * | 4/2004 | Plants | ...................... | G06F 1/10 713/500 |
| 6,941,484 B2 * | 9/2005 | To | ............................. | G06F 1/06 326/93 |
| 7,012,956 B1 * | 3/2006 | Thomsen | ............... | G11C 29/02 375/224 |
| 7,276,951 B2 * | 10/2007 | Kwak | .................... | H03K 5/133 327/158 |
| 7,453,297 B1 * | 11/2008 | Kaviani | .................... | G06F 1/10 327/149 |
| 7,548,089 B1 * | 6/2009 | Bauer | .............. | H03K 19/00323 326/101 |
| 7,564,283 B1 * | 7/2009 | Logue | ....................... | G06F 1/10 327/158 |
| 8,692,600 B1 * | 4/2014 | Blanco | .................... | H03K 5/135 327/170 |
| 9,344,066 B2 * | 5/2016 | Aremallapur | ........ | H03K 5/1565 |

* cited by examiner

*Primary Examiner* — Helene Tayong
(74) *Attorney, Agent, or Firm* — Klarquist Sparkman, LLP

(57) ABSTRACT

A system and method are described for calibrating a clock used in data transmission. In one example, dynamic phase adjustment circuitry can be used for any of a variety of different protocols to shift the clock phase with respect to a data signal. In the most typical example, the clock phase is shifted 90 degrees relative to a transmission data signal. The dynamic phase adjustment circuitry can use two cascaded programmable delay lines coupled in series. Each programmable delay line represents a half phase delay of 90 degrees. A controller can monitor an output of the programmable delay lines and incrementally add or subtract programmable delay line elements until a 180 degree phase is detected relative to a data transmission. An output clock can then be used by applying the result of the calibration delay element to the clock under discussion.

17 Claims, 10 Drawing Sheets

CLOCK PHASE ALIGNMENT IN DATA TRANSMISSION

BACKGROUND

Data transmission for protocols often requires transmitter and receiver signals to have clock and data lines synchronized. Typically, the clock should be shifted 90 degrees relative to the data transmission signals for optimum protocol performance. Having such a phase shift ensures that the data has sufficient setup time relative to the clock.

There exist techniques wherein a phase shifter can be used to determine the necessary ninety degree phase shift. One problem with such a technique is that environmental parameters (voltage, temperature, etc.) impacting the phase shifter are not identical to the environmental parameters impacting a protocol controller that uses the shifted clock signal for data transmission. Such a discrepancy in environmental parameters can result in the clock phase shift changing relative to the data.

DETAILED DESCRIPTION

A system and method are described for calibrating a clock used in data transmission. In one example, dynamic phase adjustment circuitry can be used for any of a variety of different protocols to shift the clock phase with respect to a data signal. In the most typical example, the clock phase is shifted 90 degrees relative to a transmission data signal. In one example, dynamic phase adjustment circuitry can be used for reduced gigabit media-independent interface (RGMII), serial gigabit media-independent interface (SGMII), or any other protocol wherein it is desirable to have a phase shifted clock relative to a data signal. The dynamic phase adjustment circuitry can use two cascaded programmable delay lines coupled in series. Each programmable delay line represents a half phase delay of 90 degrees. Combined, the programmable delay lines provide a full phase (half cycle) delay of 180 degrees. A controller can monitor an output of the programmable delay lines and incrementally add or subtract programmable delay line elements until a 180 degree phase is detected relative to a data transmission. An output clock can then be used from one of the two cascaded programmable delay lines such that the clock has a 90 degree phase shift. In this way, a programmable delay line is used for both a phase detection path and an operational path. In other words, the same programmable delay line is used to calibrate the phase of the clock as is used in actual operation. As such, the programmable delay lines are within the same integrated circuit used in the actual operation of the clock. As operating conditions (e.g., voltage, power, temperature, etc.) in the integrated circuit change, the same programmable delay lines will be impacted by those operational conditions. Thus, the programmable delay lines are process dependent giving a more accurate result then is achievable with a clock that is externally calibrated. And, using the same circuitry for calculating the delay as is used to generate the phase-shifted clock in actual data transmission is a savings in resources.

Figure 1:
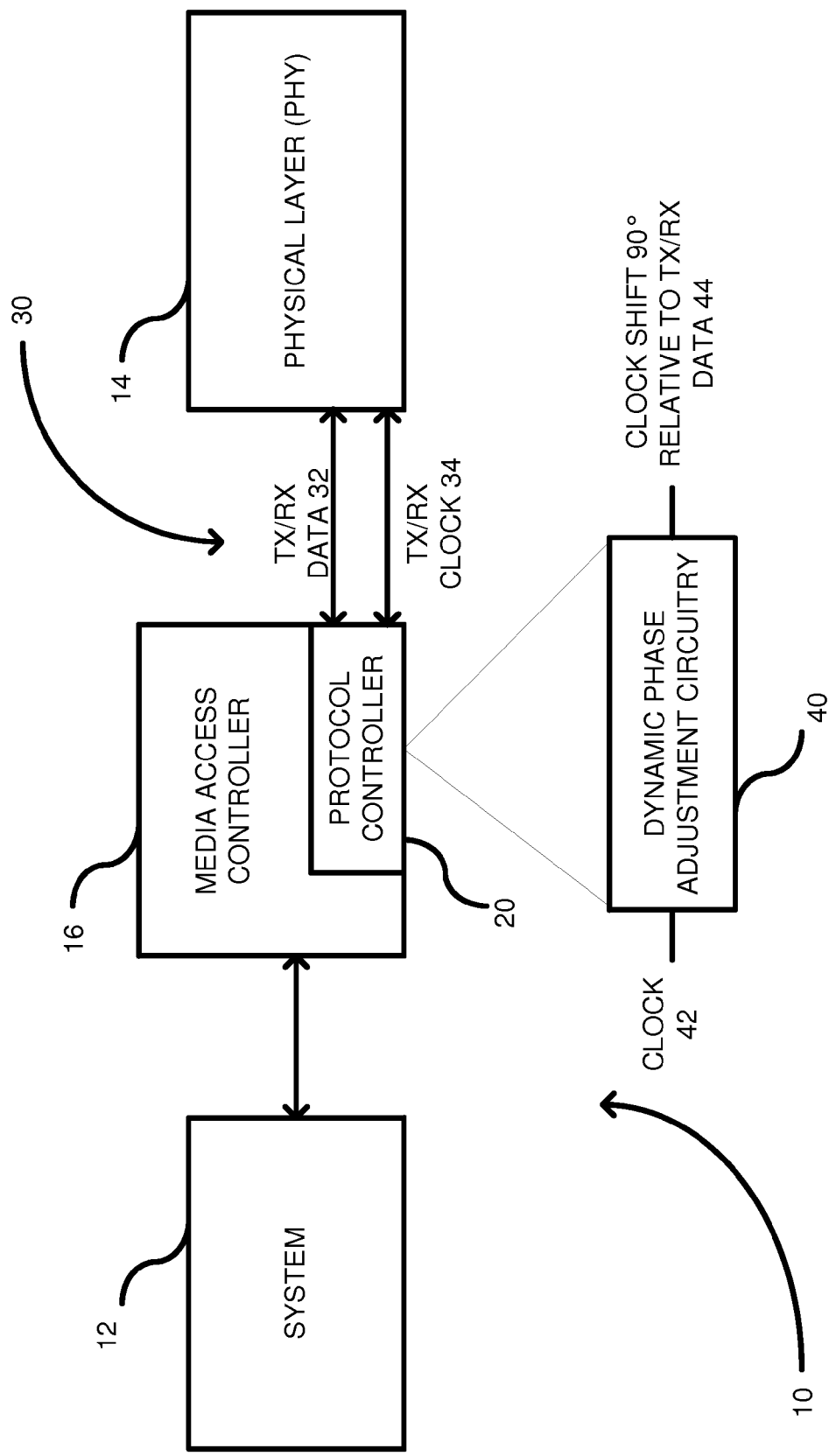
FIG. 1 is an example system diagram wherein a protocol controller within a Media Access Controller (MAC) performs a dynamic phase adjustment of the transmit (TX) and receive (RX) clock.

FIG. 1 provides an embodiment 10 that includes a main system 12 communicating with a physical layer (PHY) 14 through a Media Access Controller (MAC) 16. The MAC 16 is an Integrated Circuit (IC) that includes a protocol controller 20. Typically, the MAC 16 is an interface between a logical link control layer (which can be within the system 12) and the network physical layer 14. Communication between these layers is done via a protocol using transmission lines 30, including a data transmission line 32 and a clock transmission line 34. As described above, many protocols desire the clock to be shifted 90 degrees relative to the data. As such, the protocol controller 20 manages the clock and data transmission lines 30 to ensure the protocol is correctly implemented. Although shown within a MAC, the protocol controller 20 described herein can be used within a variety of other IC types, and is not limited to use within a MAC. The protocol controller 20 includes phase adjustment circuitry 40 used to dynamically adjust phase of the TX/RX clock 42 relative to TX/RX data so as to provide an output clock 44 that is 90 degrees shifted relative to the data. The dynamic phase adjustment circuitry 40 is within the same IC as is used for generating the TX/RX clock 34 so that any changes of environmental parameters, such as temperature, voltage, power, etc., affects the dynamic phase adjustment circuitry 40 a same amount as the IC 16 itself. Although FIG. 1 shows a MAC being used, the protocol controller 20 can be used in other ICs.

Figure 2:
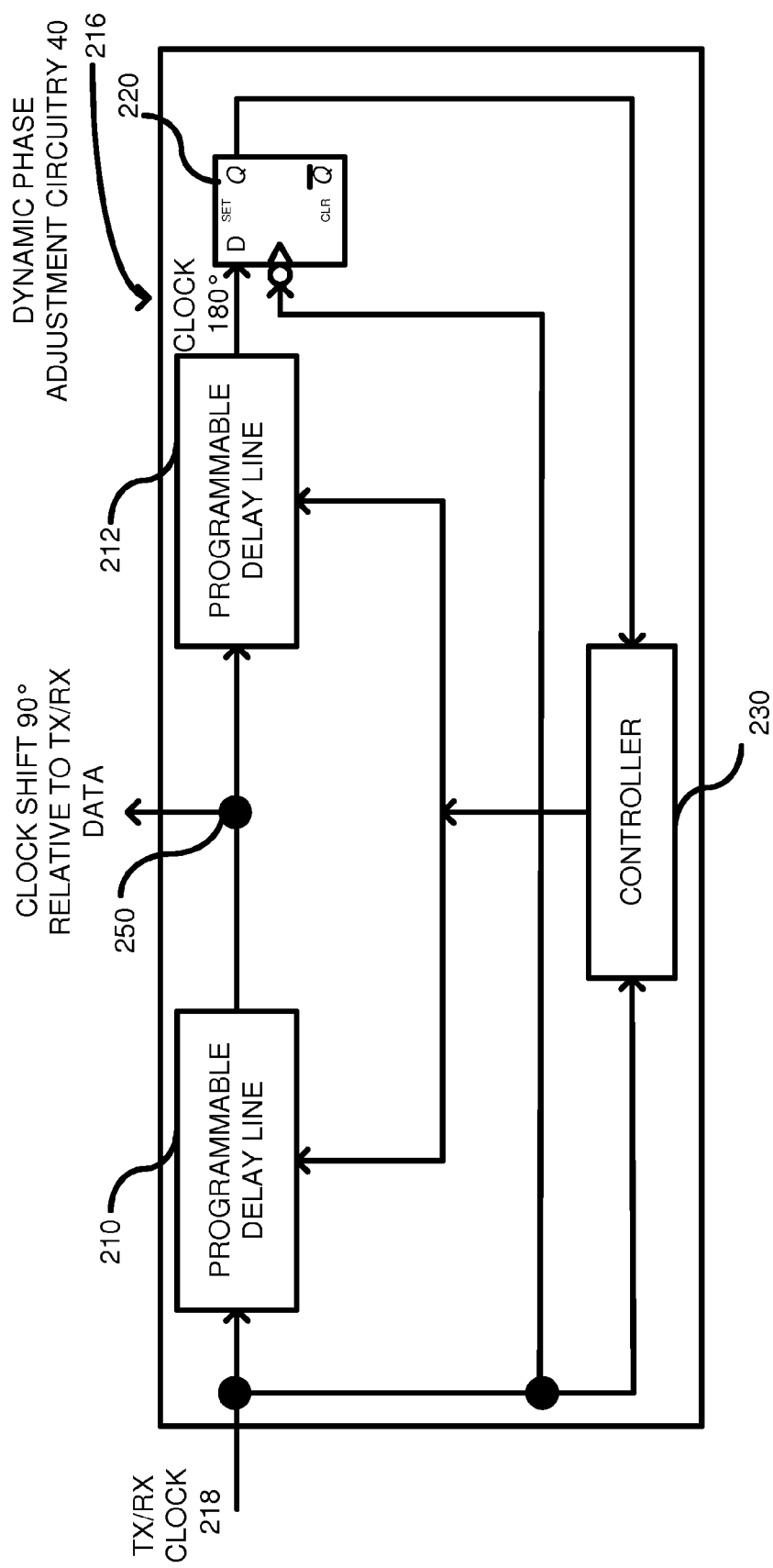
FIG. 2 is an example circuit used to dynamically adjust a phase of the TX/RX clock, wherein the circuit includes multiple programmable delay lines.

FIG. 2 shows further details of the dynamic phase adjustment circuitry 40. The circuitry 40 includes two programmable delay lines 210, 212 coupled in series. The two programmable delay lines 210, 212 can be used to generate a clock that is shifted in phase by 180 degrees relative to its initial phase, as shown at 216. A TX/RX clock signal 218 is fed into an input of the programmable delay line 210 and propagates through the series combination of both programmable delay lines 210 and 212 before being latched into a flip-flop 220. More particularly, the flip-flop 220 has a D-input that is coupled to an output of the programmable delay line 212. The flip-flop 220 also has a clock input coupled to the TX/RX clock signal 218. Thus, the same clock signal being delayed is used to capture a phase-delayed clock signal. A controller 230 is coupled to each programmable delay line 210, 212 in parallel and can incrementally add or subtract programmable delay elements, as further described below. The controller 230 is also coupled to an output of the flip-flop 220 so as to monitor changes in state of the flip-flop. Specifically, the controller 230 monitors the flip-flop for a full phase change (180 degrees) of the input clock signal 218. Once the programmable delay lines 210, 212 are programmed properly so that a full phase change is implemented, each programmable delay line 210, 212 generates a half phase delay. Thus, both programmable delay lines 210, 212 are programmed the same to have identical delays. The result is that an intermediate output node 250 positioned between the programmable delay lines 210, 212 provides a clock shift of 90 degrees relative to the TX/RX data line, assuming that the input TX/RX clock 218 is synchronized with the TX/RX data signal.

In a specific implementation, the controller 230 executes a state machine that compares the TX/RX clock 218 to the delayed clock output from the flip-flop 220 and programmatically adds or subtracts delay elements to the programmable delay lines 210, 212 so as to add or subtract delay to the clock signal. When the TX/RX clock 218 is inverted by the programmable delay lines 210, 212, then the controller 230 can determine that a phase locked state has been reached. For example, the controller can sample when the Q output of the flip-flop 220 switches state to an opposite value so as to determine that the ideal phase delay has been achieved. In the illustrated embodiment, if the delay is too small, the output switches from zero to one and if the delay is too large, the output switches from one to zero. The point at which the change of state of the flip-flop 220 aligns with a falling edge of the clock, represents a full phase change of the clock. At least one of the programmable delay lines 210, 212 used to detect the full phase change is the same programmable delay used to generate the half-phase delayed clock signal, which is used in an operational path of the circuit for data transmission. The output clock is transmitted from a node 250 intermediate the series combination of the programmable delay lines 210, 220. As a result, any environmental changes including any process variations, temperature, voltage and any other conditions that affect device performance, also impact the programmable delay lines 210, 212. Thus, by using programmable delay lines that are process dependent, the generated half phase clock is independent of impact due to environmental changes. In particular embodiments wherein the dynamic phase adjustment circuitry 40 is within an IC, such as a MAC 16 (FIG. 1), the environmental conditions that impact the MAC also impact the circuitry 40. The controller can decide whether to adapt the calibration result fully, partially, selectively, or not at all. Likewise, the RX scheme can use the value concluded by the TX calibration flow, if desired. Alternatively, the RX value can use a predetermined static value. In still other embodiments, the RX value can be calibrated independently of the TX value.

The controller 230 can be a processor, a general-purpose central processing unit (CPU), processor in an application-specific integrated circuit (ASIC) or any other type of processor. Still further, the controller 230 can be any logic that can execute a state machine capable of performing the functionality described herein.

Although two programmable delay lines are shown in FIG. 2, additional programmable delay lines can be added. By so doing, phases other than 90 degrees can be calculated. For example, three programmable delay lines can be coupled in series and when a 180 degree phase shift is detected at 216, then an output of the first programmable delay line is 60 degrees and the second is 120 degrees. Further programmable delay lines can be added to generate other phases that are derivatives of 180 degrees.

Figure 3:
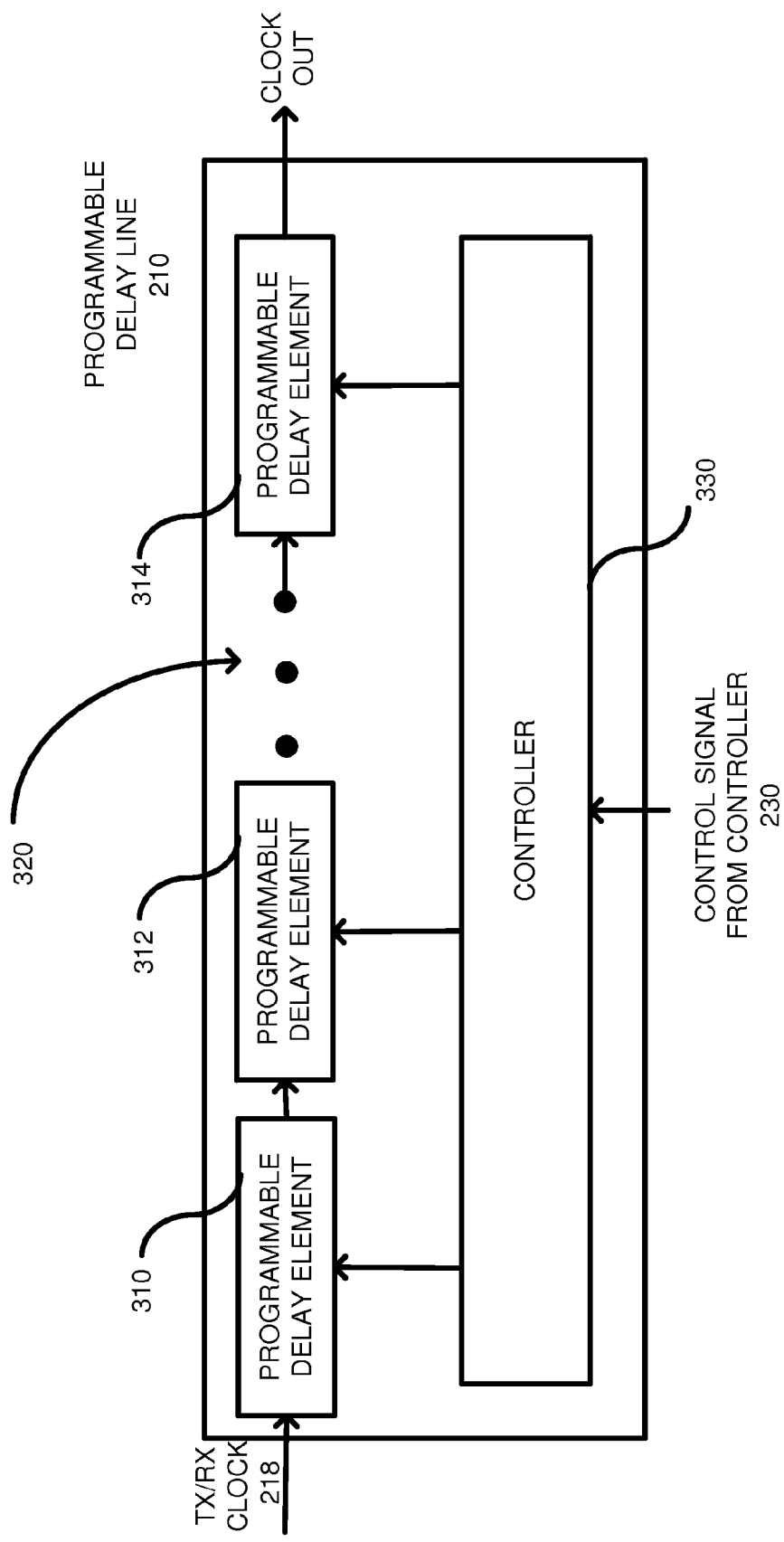
FIG. 3 is an example programmable delay line circuit of FIG. 2 including multiple programmable delay elements.

FIG. 3 shows further details of the programmable delay line 210, which is identical to the programmable delay line 212. The programmable delay line 210 includes a plurality of programmable delay elements 310, 312, 314. Any number of programmable delay elements can be combined in series depending on the particular design, as indicated by the repeating dots shown at 320. A controller 330 is responsive to control signals from the controller 230 (FIG. 2) to program the delay elements 310, 312, 314 so as to either insert a delay in the series combination or bypass the delay element so that the programmable delay element is effectively a short (or relatively small delay). The controller 330 can be similar to the controller 230 in its structure, which is described above. Alternatively, the controller 330 can be eliminated and the controller 230 can direct control the programmable delay elements.

Figure 4:
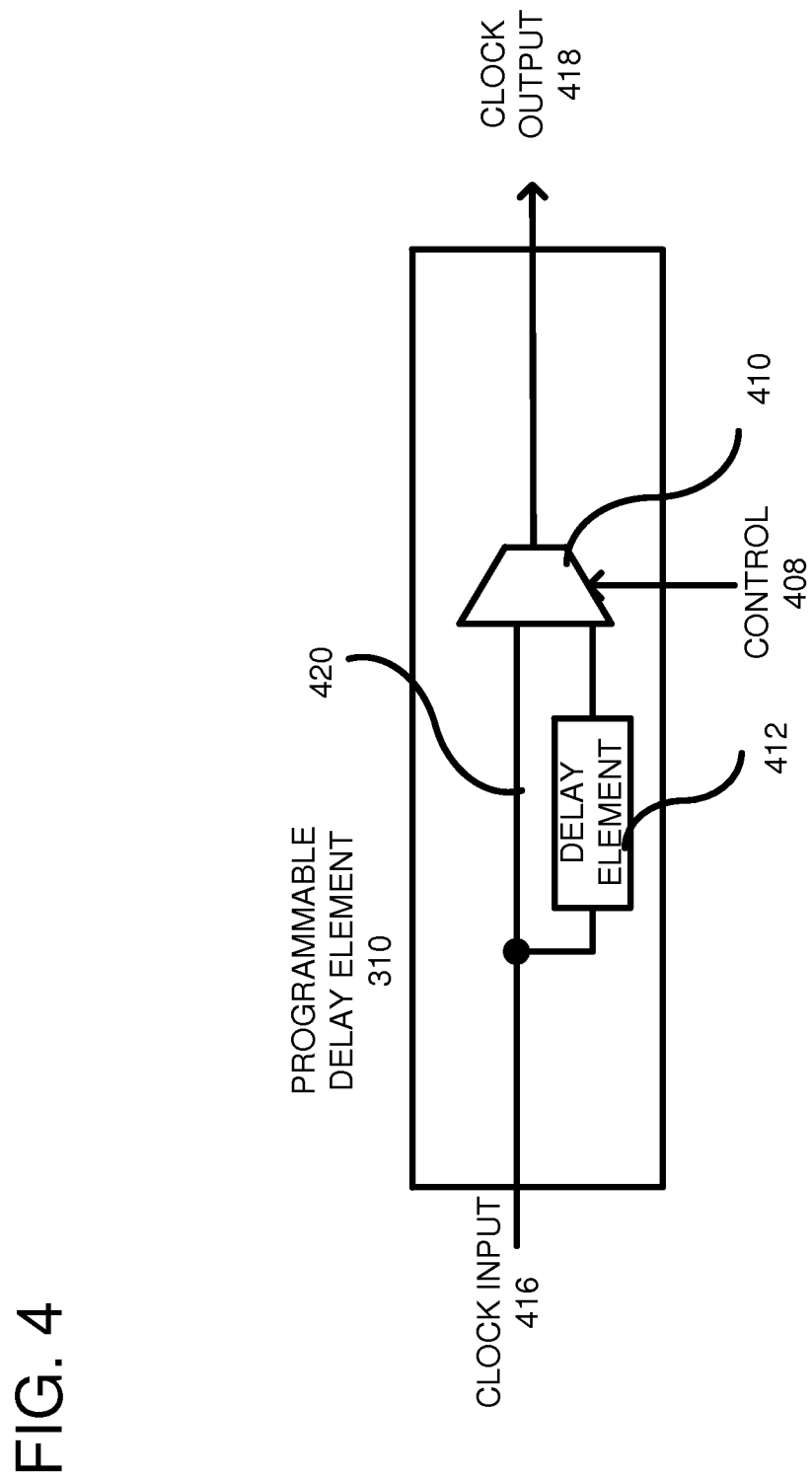
FIG. 4 is an example programmable delay element of FIG. 3.

FIG. 4 is an example programmable delay element, such as delay element 310 from FIG. 3. A control line 408 from a controller 330 is coupled to a multiplexer 410. The multiplexer 410 either allows a delay element 412 or a bypass line to be inserted between a clock input 416 and a clock output 418. The delay element 412 can be made of any desired logic, such as a series of inverters (not shown) and can be a delay of any desired amount of time. The bypass line 420 can add a small delay, but it is negligible compared to the delay element 412. Thus, a multiplexer allows external control so as to provide either a near-zero delay or a predefined delay period. Other designs can be used, such as replacing the multiplexer by gate logic to achieve a similar function.

Figure 5:
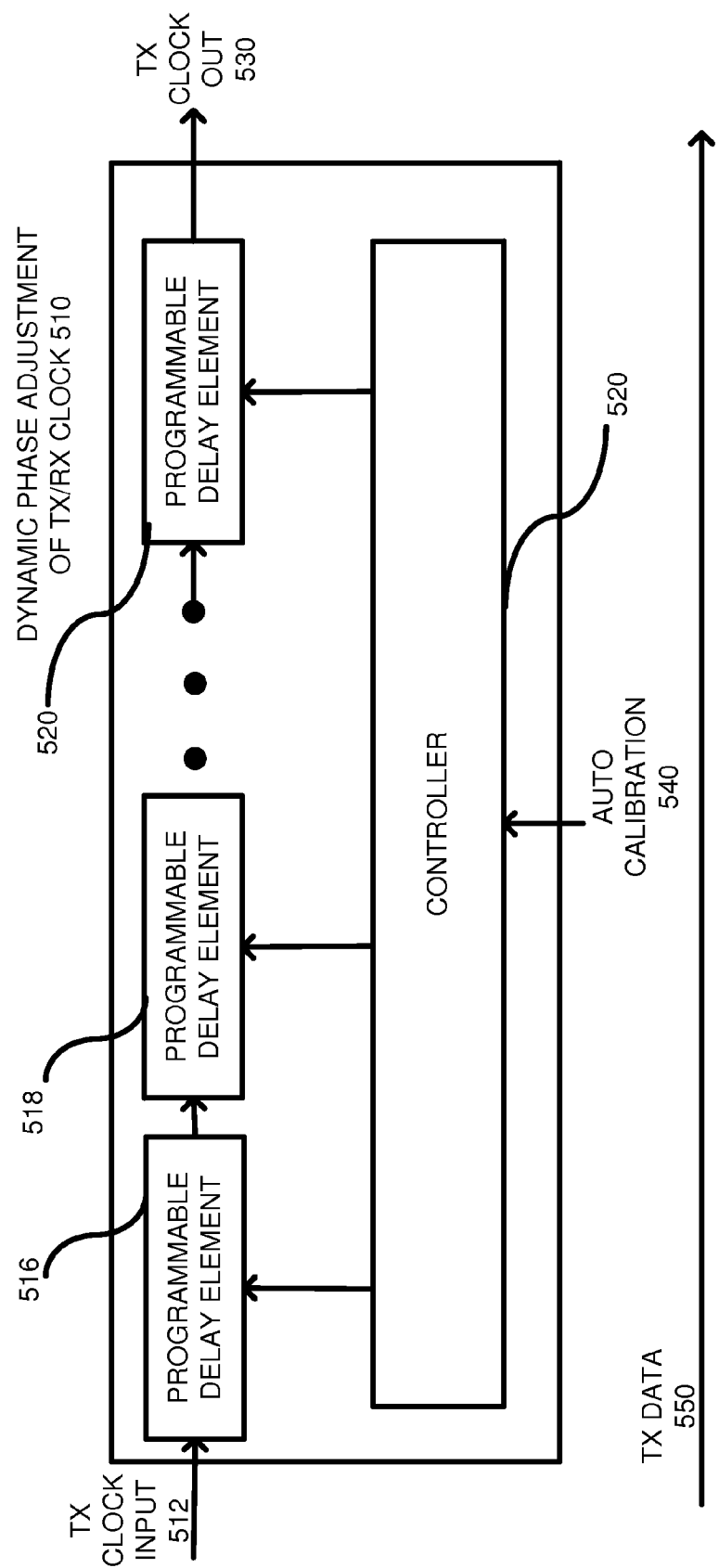
FIG. 5 is another embodiment of a circuit used to dynamically adjust the TX/RX clock.

FIG. 5 shows an embodiment wherein a circuit 510 is shown for dynamic phase adjustment of the TX/RX clock 512. The circuit 510 includes a plurality of N (where N is any integer number) programmable delay elements 516, 518, 520 coupled in series (wherein element 520 is the Nth element in the series). A controller 520 controls the programmable delay elements to selectively insert or subtract a quantifiable delay amount within the delay line between the clock input 512 and the output clock 530. The controller is responsive to an autocalibration signal 540. If it is assumed that the controller is provided a programming control value, then that value can be applied to the single dynamic phase adjustment circuit 510 in order to provide a half-phase delay on the clock output 530. Thus, the output clock 530 can be a 90 degree phase shift with respect to the data signal 550.

Figure 6:
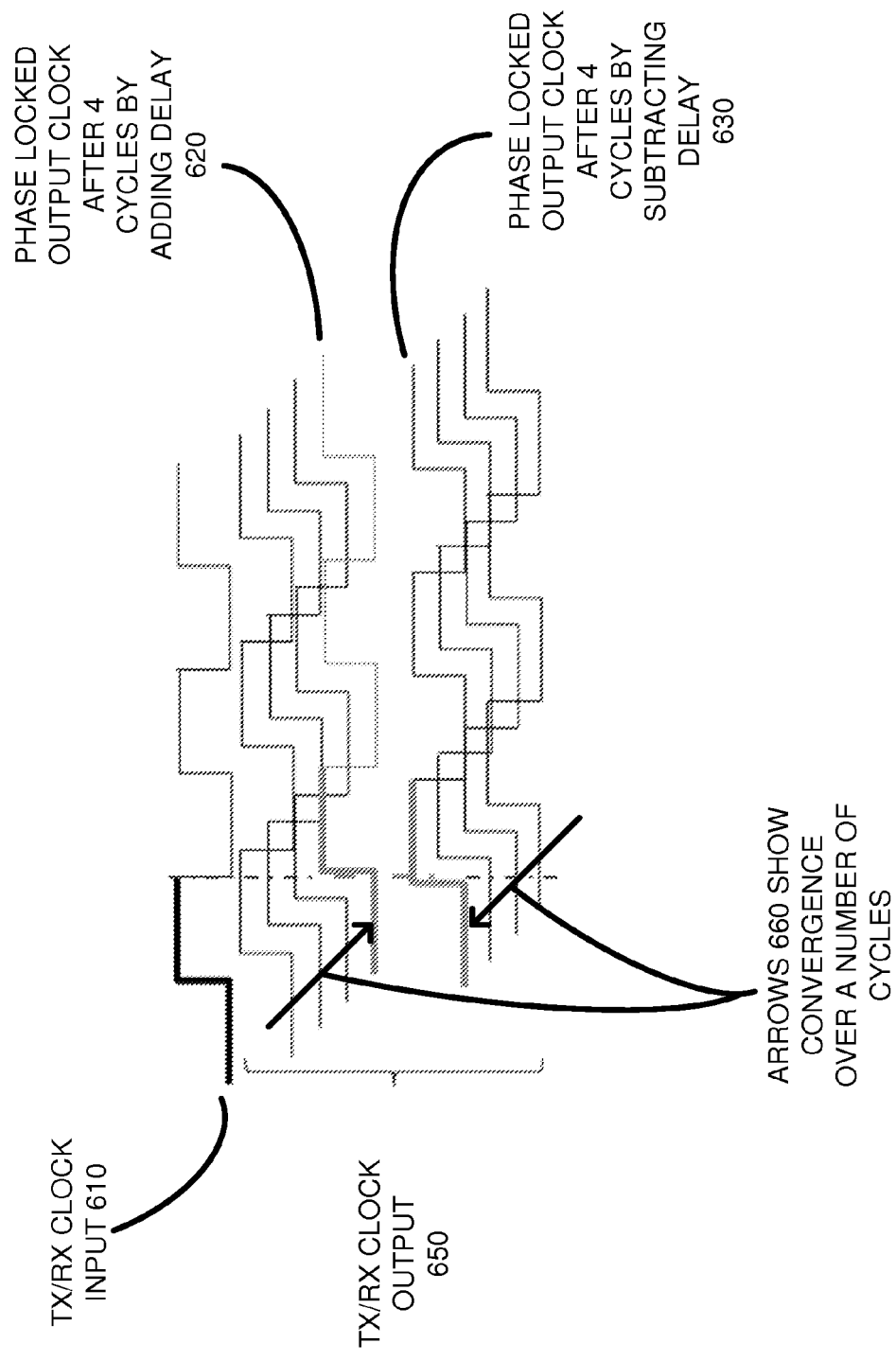
FIG. 6 shows example waveforms of a TX clock as it is dynamically shifted.

FIG. 6 shows an example timing diagram during operation of the circuits described above. An input TX/RX clock to be shifted is shown at 610. A TX/RX clock output 650 is phase shifted using four added delay elements to move the phase of the TX/RX clock output 650 until it is phase locked as shown at 620. Each time a controller detects a logical high, it adds a delay element so as to move the phase of the clock signal, which is represented by showing the clock signal over a number of time sequences with the phase being shifted. More specifically, adding a delay element means switching a programmable delay element (e.g., see delay element 310 in FIG. 4) so that it uses a delay element 412 instead of a bypass line 420. Once a logic low is detected, the circuit is considered phase locked.

Alternatively, if the clock output 650 is already shifted more than 90 degrees (due to environmental effects such as temperature or voltage that affected the device behavior), then the number of delay elements can be subtracted until the clock output becomes phase locked as shown at 630. Arrows 660 show a direction of convergence for the phase-shifted clock signal for both addition and subtraction. Although four shifts are shown, in actual use cases, the shifting can be any number of shifts based on the resolution.

Figure 7:
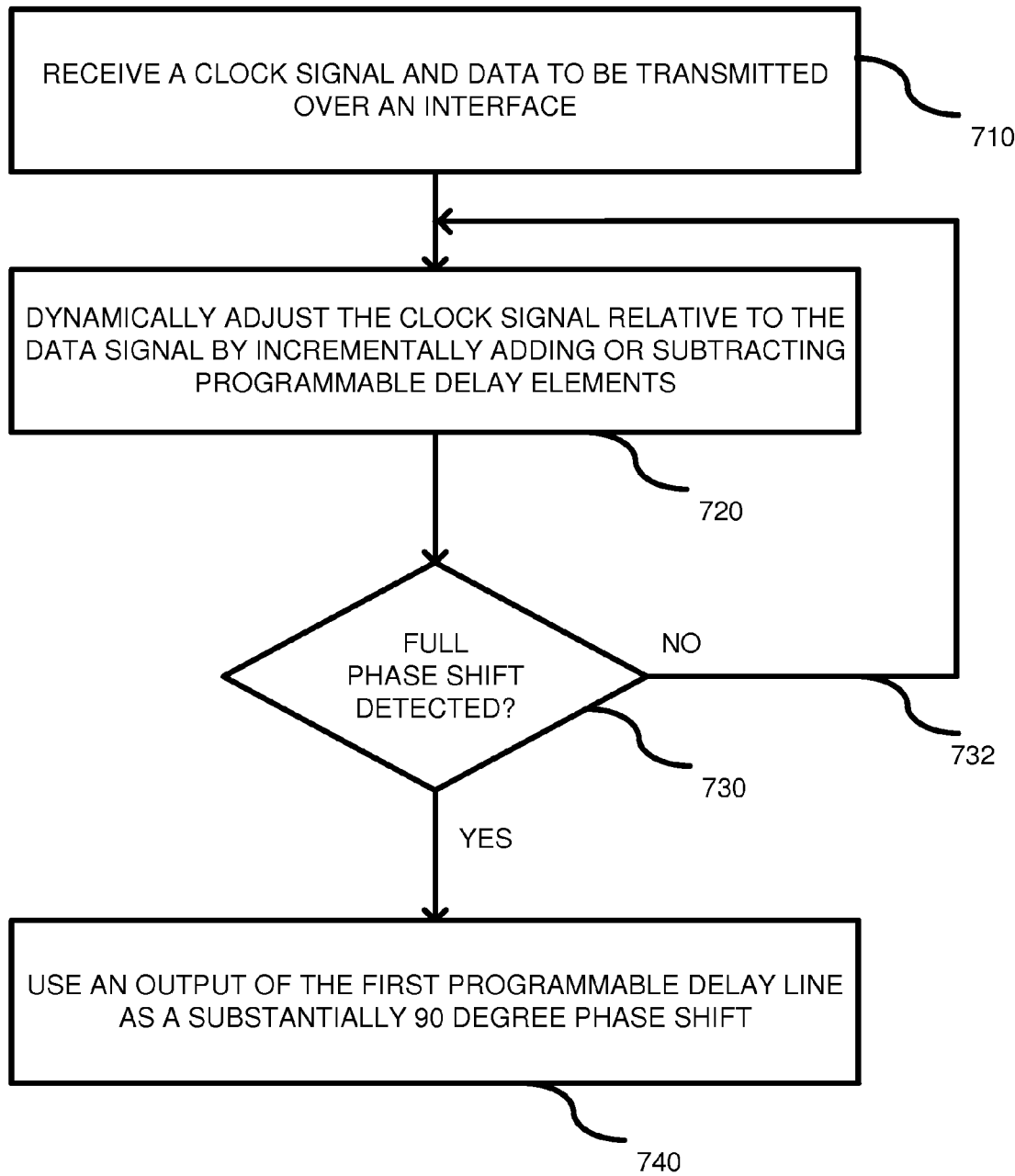
FIG. 7 is an example flowchart of an embodiment for dynamically shifting a phase of a TX/RX clock.

FIG. 7 is a flowchart of a method for calibrating a clock used for data transmission. In process block 710, a clock signal and a data signal are received, both of which are to be transmitted over an interface using a protocol. A variety of protocols can be used for any desired interface. Some example protocols include a reduced gigabit media-independent interface (RGMII), serial gigabit media-independent interface (SGMII), 10-gigabit media-independent interface, and other interfaces, such as GBIC, XAUI, SFP, SFF, XFP, etc. The received clock signal and data signal are synchronized, such that determining a 90 degree phase shift in the clock results in the clock signal being 90 degrees out of phase relative to the data signal. The received clock signal and data signal are within an integrated circuit, and any phase shift is implemented within the same integrated circuit. Subsequently, the same integrated circuit is also used in the data transmission. As a result, in this embodiment, no phase calculations are made external to the integrated circuit so that environmental parameters affecting the integrated circuit likewise affect the phase calculation.

In process block 720, the clock signal is dynamically adjusted relative to the data signal by incrementally adding or subtracting programmable delay elements. For example, turning to FIG. 2, if the controller 230 determines that the flip-flop output is high, then further delay elements 412 (FIG. 4) can be added to the programmable delay lines 210, 212 through controlling the multiplexer 410 to select the electrical path with the delay element.

In decision block 730, the controller 230 adds one delay element and then waits to see if the flip-flop switches to an opposite value at the time of the negative clock edge. If the flip-flop does not change value, then at 730 the process loops as indicated by arrow 732 back to process block 720. For example, the controller can add additional delay elements to further move the phase of the clock signal until a full phase shift (i.e., half of a cycle or 180 degree shift) is detected. Once a full phase shift is detected, then decision block 730 is answered in the affirmative and the process continues onto process block 740. The controller can then use the number of delay elements used in the series connection as a control value for reaching an exact delay using the same environmental conditions as in generating the operational clock shifted 90 degrees relative to the data. The clock on an intermediate node (e.g., node 250 in FIG. 2) can then be used in the operational path for a phase-shifted clock transmission. The output is from the first programmable delay line with a substantially 90 degree phase shift. The term "substantially" is used because there may be, for example, a ±10 to 20% shift depending on the time delay of the delay elements relative to the overall time of the clock phase. An exact 90 degree phase shift is not needed to implement the circuit effectively. If finer resolution is desired, the number of delay elements can be increased. An example implementation is as follows:

Assume a clock cycle of 125 MHz having an 8n second full period which implies a 90 degrees phase shift of 2n seconds. By using delay elements that are less than 100p seconds per element (e.g., average 80p seconds), and having 64 elements in a single programmable delay element, the resolution is 100p seconds/8n seconds, which is +/−1.25% or 4.5 degrees. In that case +/−5% of the 90 degree phase shift is achieved. The resolution varies depending on the particular design details. For example, 128 or 256 programmable delay elements can be used to obtain better resolution.

Figure 8:
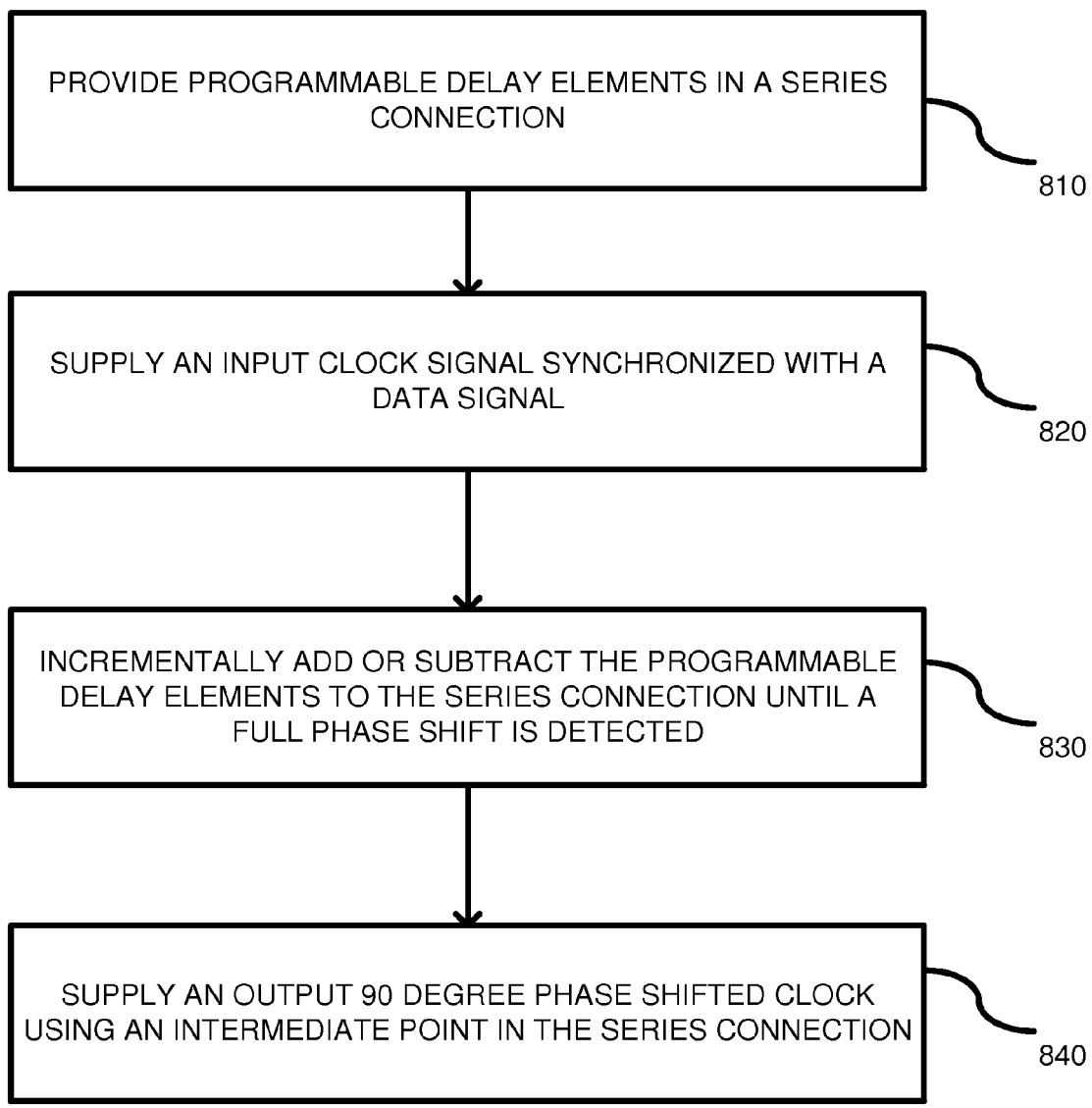
FIG. 8 is an example flowchart of another embodiment for dynamically shifting a phase of a TX/RX clock.

FIG. 8 shows a flowchart of a method of supplying a clock signal used in data transmission. In process block 810, programmable delay elements are provided that are coupled in a series connection. The delay elements are programmable because they can be added to or subtracted from the series connection by a controller that controls a multiplexer, for example, such as is shown in FIG. 4. In process block 820, an input clock signal is supplied that is synchronized with a data signal. The clock signal can be used in data transmission, such as a clock used to transmit data according to a predefined protocol. In one embodiment, synchronized means that the clock signal and data signal are phase matched. In process block 830, a controller can incrementally add or subtract programmable delay elements to the series connection until a full phase shift is detected. Incrementally adding, for example, can mean that one or more delay elements are added and then a period of time is waited to determine if a full phase shift is detected. If the full phase is not detected, then additional delay elements can be added and the process can repeat until the full phase is detected. A similar process can be used for subtracting delay elements. Using such techniques, the controller can programmatically modify an amount of delay associated with the programmable delay lines. In process block 840, an output clock is supplied that is phase shifted 90 degrees relative to the input clock and relative to the data signal. The output clock can be supplied from an intermediate point in the series connection. For example, in FIG. 2, the intermediate point is half way between the start and the end of the series connection with respect to delay lines.

A particular design can be implemented wherein a register within the controller includes the following potential fields. Values stored in these fields control operation of the controller 230. For example, the controller 230 can include a 30 bit register having a format as described below. Additional fields can be added or some of the fields below can be subtracted. The following terms are used in the register description: Delay Line Calibration (DLC) relates to the overall system described above wherein an appropriate number of programmable delay elements are calculated in order to achieve a desired phase adjustment of an input clock. Phase Lock Loop (PLL) refers to one of multiple techniques that can be used in generating the input TX/RX clock. Read Only (RO) and Write Only (WO) refers to an ability of an outside source (e.g., the MAC 16) to read or write to the register.

| Register Bits | Field Description | Default | Comments |
|---|---|---|---|
| 31 | Double Data Rate Mode | 1'b1 | Single/Double data rate operation mode. |
| 30 | DLC enable | 1'b0 | Allow the sweep procedure and the usage of its results. |
| 29 | DLC Tx - allow auto relock | 1'b0 | Allow the sweep result to be saved as the static value serving the Tx channel delay. |
| 28 | DLC Rx - allow auto relock | 1'b0 | Allow the sweep result to be saved as the static value serving the Rx channel delay. |
| 27 | Select Clock for DLC sweep | 1'b0 | Select PLL channel or Eth TxCLK. Default is PLL (Phase Locked Loop). |
| 26 | Read Only (RO) Status: DLC Error | 1'b0 | Delay line sweep failed to lock and reached timeout. |
| 25 | RO Status: DLC Done | 1'b0 | Delay line sweep is done (and locked) |
| 24 | RO Status: DLC Busy | 1'b0 | Delay line sweep in progress |
| 24 | Write Only (WO)trigger: DLC Flow | — | Once DLC enabled (bits 30:27 are set as needed), write again to this register with bit 24 set to start the sweep flow |

| Register Bits | Field Description | Default | Comments |
|---|---|---|---|
| 23 | Start WO trigger: DLC Clear | — | Clear the state machine and go back to idle Requires bit [30] DLC enable to be asserted prior to this access. |
| 22 | WO trigger: DLC Offset load en | — | Load offset (pwdata bits [21:16]) as the start point for the sweep. Bit [30] DLC enable - should be asserted prior to this access. |
| 21:16 | RO Status: DLC value | 6'd0 | Delay sweep flow result |
| 21:16 | WO Offset: DLC offset value | — | Delay sweep flow start value, if bit [22] offset enable is asserted |
| 13:8 | Tx Delay configuration | 6'd0 (Bypass) | If DLCenabled and tx_DLC enabled, HW updated at Lock. Otherwise - static configuration |
| 5:0 | Rx Delay configuration | 6'd0 (Bypass) | If DLC enabled and rx_DLC enabled, HW updated at Lock. Otherwise - static configuration. |

If DLC_Enable (Bit [30]) is not set, then dynamic modes are not enabled. The dynamic mode means that the controller 230 (FIG. 2) can begin a so-called sweep cycle wherein it automatically calibrates a number of delay elements needed to shift the input TX/RX clock 218 by 180 degrees at 216 or 90 degrees at node 250 relative to TX/RX clock received at 218. To enable the DLC flow, bit [30] is set. Bits [24:16] are triggers for flows. Bit [21:16] is the offset value from which the sweep starts. Bit [22] allows a load of the start-point offset, otherwise starting from a last known sweep result. If there are not previously stored values for delay elements then this value can start at 0, but after a first value is determined, the starting point can be adjusted to be more near the phase lock so as to speed up a time to lock. For example, if 20 delay elements was previously calculated for a 180 degree phase shift at 216 (FIG. 2) then a sweep for determining a current number of delay elements can start at 20. Thus, an assumption can be made that environmental conditions may have changed the number of delay elements needed, but it likely is still close to the previously computed number of delay elements. Bit [23] clears the state machine in case of error. Thus, the state machine running in the controller 230 can start anew to determine the number of delay elements. Bit [24] triggers the sweep. For example, when this bit is set, the controller 230 can send signals to the programmable delay lines 210, 212 to change the number of delay elements used. Bits [26:16] are for status reporting and publishing the result of the sweep. For example, the controller 230 can communicate with external hardware (e.g., the MAC 16) that requests the results of the sweep. Bit [26] relates to when the sweep failed to lock. Bit [25] indicates when a value was found and successfully locked. Bit [24] indicates when a sweep is in progress. This bit can be used by the MAC 16 (FIG. 1) to suspend transmission until the protocol controller 20 is ready to transmit. Bits [21:16] represent that a delay value was reached, meaning a number of delay elements needed to shift the clock by 180 degrees, so that the output clock can be shifted 90 degrees, as shown at node 250 in FIG. 2. It should be noted that bits [24] and [21:16] serve dual functions, such that when the bits are written they represent one function (triggering the flows) and when the bits are read, they represent a different function (status and result). For example, these bits can be read by the MAC 16 as status or result information.

Figure 9:
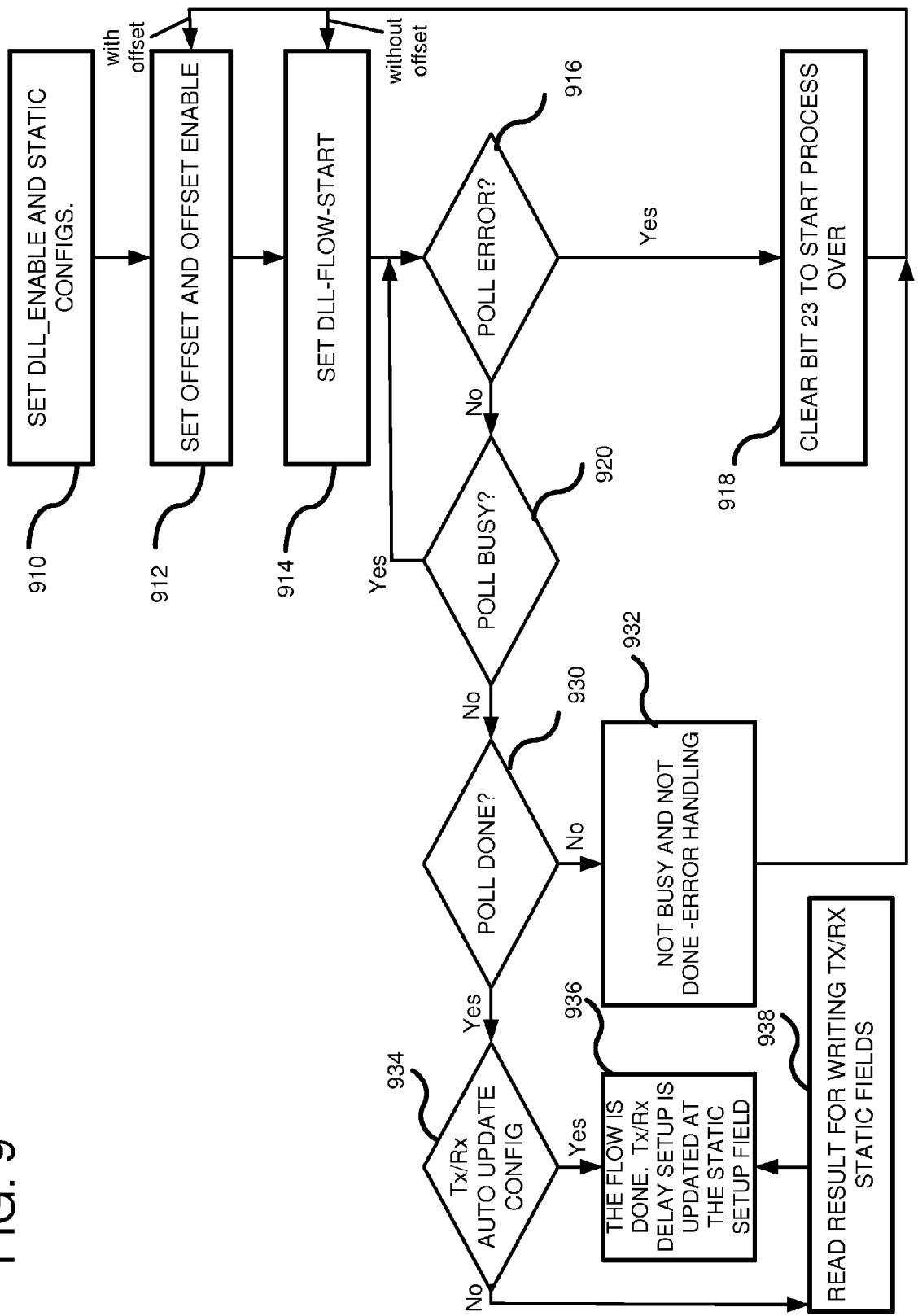
FIG. 9 is a flowchart showing how a specific implementation shifts a phase of the TX/RX clock.

FIG. 9 is a more detailed flowchart showing how the above described register can be used in conjunction with the circuitry described herein. In process block 910, the DLC bit can be enabled to start an autonomous calibration of a clock signal used in data transmission. Setting a configuration of the dynamic phase adjustment circuitry 40 can include setting predetermined bits within the above-described register so as to provide the desired functionality. In process block 912, an offset can be used to accelerate the sweep process. For example, if the circuit previously established that 20 delay elements was a correct number, then that number or one similar can be used as a starting point, rather than starting from 0 delay elements. In process block 914, bit 24 is set to indicate that a sweep is currently in progress. In decision block 916, a determination is made whether an error condition exists. If so, then in process block 918, bit 23 is cleared and the process can start over. Otherwise, in decision block 920, the controller calibrates the dynamic phase adjustment circuitry by adding or subtracting delay elements as needed until a full cycle phase change is detected. This period while the controller is calibrating is called a polling period. Once the polling is not occurring (i.e., the polling is not busy), then in decision block 930, a check is performed to determine if polling is completed. If not, then in process block 932, an error condition occurs and the process restarts. One example error condition is if a predetermined period of time elapses without a result occurring. If polling is completed, then in decision block 934, TX/RX auto update configuration is checked. The TX/RX auto update configuration allows software to determine whether or not to use the calculated delay (also called the TX/RX delay). In some cases, the calculated delay can be used for both TX and RX clock signals. In other cases, only one of TX and RX clock signals use the calculated delay. In still other cases, the calculated delay need not be used at all. If it is set, then in process block 936, the auto-configuration is complete and the TX/RX delay that was calculated is updated in the static setup field for future calibrations. Otherwise, in process block 938, the result can be read for writing the TX/RX static fields.

Figure 10:
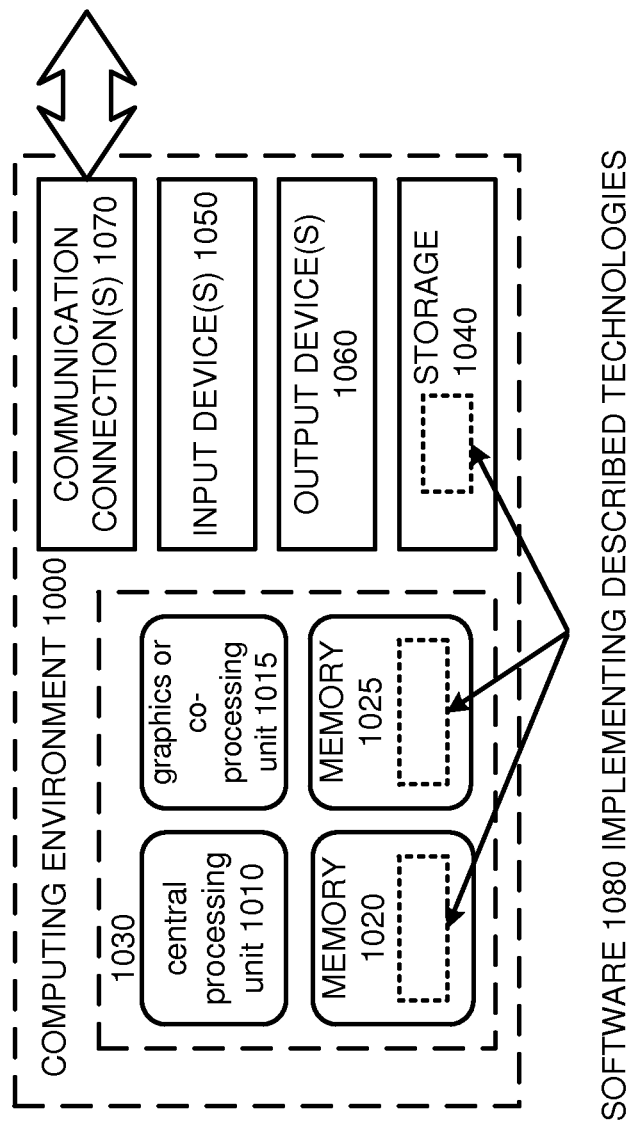
FIG. 10 depicts a generalized example of a suitable computing environment in which the described innovations may be implemented.

FIG. 10 depicts a generalized example of a suitable computing environment 1000 in which the described innovations may be implemented. The computing environment 1000 is not intended to suggest any limitation as to scope of use or functionality, as the innovations may be implemented in diverse general-purpose or special-purpose computing systems. For example, the computing environment 1000 can be any of a variety of computing devices.

With reference to FIG. 10, the computing environment 1000 includes one or more processing units 1010, 1015 and memory 1020, 1025. In FIG. 10, this basic configuration 1030 is included within a dashed line. The processing units 1010, 1015 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 10 shows a central processing unit 1010 as well as a graphics processing unit or co-processing unit 1015. The tangible memory 1020, 1025 may be volatile memory (e.g., registers, cache, RAM), non-volatile memory (e.g., ROM, EEPROM, flash memory, etc.), or some combination of the two, accessible by the processing unit(s). The memory 1020, 1025 stores software 1080 implementing one or more innovations described herein, in the form of computer-executable instructions suitable for execution by the processing unit(s). For example, the software can be used to execute the above-described state machine if desired. Alternatively, the state machine can be implemented in hardware.

A computing system may have additional features. For example, the computing environment 1000 includes storage 1040, one or more input devices 1050, one or more output devices 1060, and one or more communication connections 1070. An interconnection mechanism (not shown) such as a bus, controller, or network interconnects the components of the computing environment 1000. Typically, operating system software (not shown) provides an operating environment for other software executing in the computing environment 1000, and coordinates activities of the components of the computing environment 1000.

The tangible storage 1040 may be removable or non-removable, and includes magnetic disks, magnetic tapes or cassettes, CD-ROMs, DVDs, or any other medium which can be used to store information in a non-transitory way and which can be accessed within the computing environment 1000. The storage 1040 stores instructions for the software 1080 implementing one or more innovations described herein.

The input device(s) 1050 may be a touch input device such as a keyboard, mouse, pen, or trackball, a voice input device, a scanning device, or another device that provides input to the computing environment 1000. The output device (s) 1060 may be a display, printer, speaker, CD-writer, or another device that provides output from the computing environment 1000.

The communication connection(s) 1070 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Application-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

What is claimed is:

1. A method of calibrating a clock used for data transmission, the method comprising:
   (a) in a protocol controller, receiving a clock signal and a data signal to be transmitted over an interface;
   (b) using the protocol controller, dynamically adjusting the received clock signal relative to the data signal by incrementally adding or subtracting programmable delay elements to first and second programmable delay lines coupled in series, the first programmable delay line having the received clock signal as an input, wherein the programmable delay elements have switching logic for either bypassing an intermediate programmable delay element which is one of the programmable delay elements in the series or coupling the intermediate programmable delay element in the series;

(c) repeating (b) until a full phase shift is detected in the adjusted clock signal relative to the data signal; and (d) in response to detecting the full phase shift, using an output of the first programmable delay line as a 90° phase shift of the received clock signal.

2. The method of claim 1, wherein the detection of the full phase shift is performed using the first programmable delay line that is used to output the 90° phase shift.

3. The method of claim 1, wherein a flip-flop coupled to an output of the second programmable delay line, is clocked by the received clock signal.

4. The method of claim 3, wherein the full phase shift is detected when the flip-flop changes state.

5. An apparatus, comprising:
an input clock node;
first and second programmable delay lines coupled in series, with an input of the first programmable delay line coupled to the input clock node;
a controller coupled to an output of the second programmable delay line, the controller programmed to detect a phase shift relative to a clock signal on the input clock node, the controller further coupled to each of the first and second programmable delay lines for programmatically modifying an amount of delay provided by the first and second programmable delay lines, wherein each of the first and second programmable delay lines includes a plurality of programmable delay elements that can be selectively programmed to insert a delay element in series or bypass the delay element; and
an output clock node coupled between the first programmable delay line and the second programmable delay line for outputting an output clock signal having a phase shift relative to the clock signal.

6. The apparatus of claim 5, wherein each programmable delay element includes a multiplexer, the multiplexer having a control line coupled to the controller, a first input including a bypass circuit path, and a second input including a delay element path.

7. The apparatus of claim 5, wherein the controller is a first controller and each programmable delay line includes a second controller that performs the programmatic modifying in response to the first controller.

8. The apparatus of claim 7, further including a flip-flop coupled to an output of the second programmable delay line and to the input clock node, wherein an output of the flip-flop is coupled to the first controller for detecting a change in state of the flip-flop.

9. The apparatus of claim 5, wherein the apparatus is a single integrated circuit that supplies an output clock signal from the clock output node and a data signal on an output data node, wherein the clock signal is shifted 90° relative to the data signal.

10. The apparatus of claim 5, wherein the programmatically modifying includes adding or subtracting delay line elements and waiting a predetermined period of time for a detection of a change in state.

11. The apparatus of claim 5, wherein one, both or a combination thereof of the programmable delay lines are used for both a phase detection path and an operational path.

12. The apparatus of claim 5, wherein the clock signal supplied on the input clock node is shifted 90° on the output clock node.

13. A method, comprising:
providing programmable delay elements in a series connection;
supplying an input clock signal synchronized with a data signal to a first of the programmable delay elements coupled in series to a last of the programmable delay elements so as to delay the input clock signal;
monitoring for a change in state of a flip-flop coupled to the last of the programmable delay elements, wherein the input clock signal is coupled to the flip-flop so as to capture an output of the last programmable delay element;
incrementally adding or subtracting the programmable delay elements to the series connection until a selected phase shift is detected; and
supplying an output phase shifted clock signal using an intermediate point in the series connection of the programmable delay elements.

14. The method of claim 13, wherein the output phase shifted clock signal is phase shifted 90° relative to a data signal.

15. The method of claim 14, wherein the output phase shifted clock signal and the data signal are generated within a protocol controller of a Media Access Controller.

16. The method of claim 13, wherein the programmable delay elements include a multiplexer having a first bypass path and a second delay line element path, wherein a controller switches the multiplexer to perform the incremental adding or subtracting of the programmable delay element.

17. The method of claim 13, wherein the programmable delay line elements include a first group of programmable delay line elements and a second group of programmable delay line elements.

* * * * *